US008028744B2

(12) United States Patent
Kumar et al.

(10) Patent No.: US 8,028,744 B2
(45) Date of Patent: *Oct. 4, 2011

(54) HEAT SINK SYSTEM AND ASSEMBLY

(75) Inventors: Ajith Kuttannair Kumar, Erie, PA (US); Theodore Clark Brown, Ripley, NY (US); Roland Donajkowski, Erie, PA (US)

(73) Assignee: General Electric Company, Schenectady, NY (US)

( * ) Notice: Subject to any disclaimer, the term of this patent is extended or adjusted under 35 U.S.C. 154(b) by 89 days.

This patent is subject to a terminal disclaimer.

(21) Appl. No.: 12/340,824

(22) Filed: Dec. 22, 2008

(65) Prior Publication Data

US 2009/0101307 A1  Apr. 23, 2009

Related U.S. Application Data

(63) Continuation of application No. 11/291,247, filed on Dec. 1, 2005, now Pat. No. 7,472,742.

(51) Int. Cl.
*H05K 7/20* (2006.01)
(52) U.S. Cl. ...................................... 165/80.3; 361/704
(58) Field of Classification Search .................. 361/695, 361/697, 704; 165/80.3, 121, 122, 185
See application file for complete search history.

(56) References Cited

U.S. PATENT DOCUMENTS

| 4,765,397 | A | * | 8/1988 | Chrysler et al. | 165/80.3 |
| 5,038,858 | A | * | 8/1991 | Jordan et al. | 165/185 |
| 5,535,094 | A | * | 7/1996 | Nelson et al. | 361/697 |
| 5,832,986 | A | * | 11/1998 | Kenny et al. | 165/80.3 |
| 6,118,656 | A | * | 9/2000 | Wang | 361/704 |
| 7,472,742 | B2 | * | 1/2009 | Kumar et al. | 165/80.3 |
| 2003/0155106 | A1 | * | 8/2003 | Malone et al. | 165/80.3 |
| 2003/0210526 | A1 | * | 11/2003 | Huang et al. | 361/697 |

* cited by examiner

*Primary Examiner* — Leonard Leo
(74) *Attorney, Agent, or Firm* — Robert Wawrzyn, Esq.; Terry M. Sanks, Esq.; Beusse Wolter Sanks Mora & Maire, P.A.

(57) ABSTRACT

A heat sink system with reduced airborne debris clogging, for cooling power electronics, the heat sink system including a heat sink having a plurality of fins, a housing configured to direct air flow around the side, top, and/or bottom of the heat sink and then through the fins of the heat sink at a back of the heat sink, and an inlet airway passage formed between a wall of the housing and said side, top, and/or bottom of the finned heat sink to allow air to pass within the housing, wherein said side, top, and/or bottom of the heat sink comprises at least one of said plurality of fins disposed directly in contact with the inlet airway passage.

7 Claims, 6 Drawing Sheets

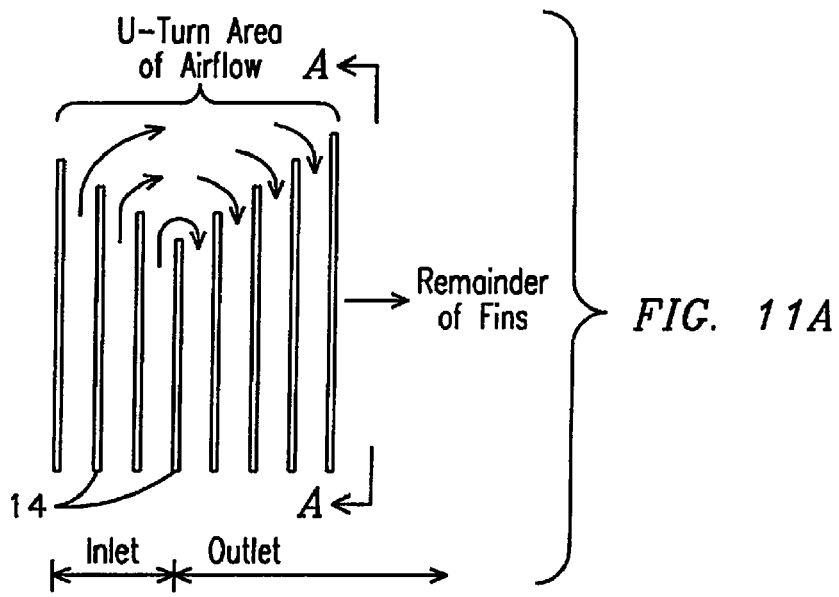
FIG. 11A
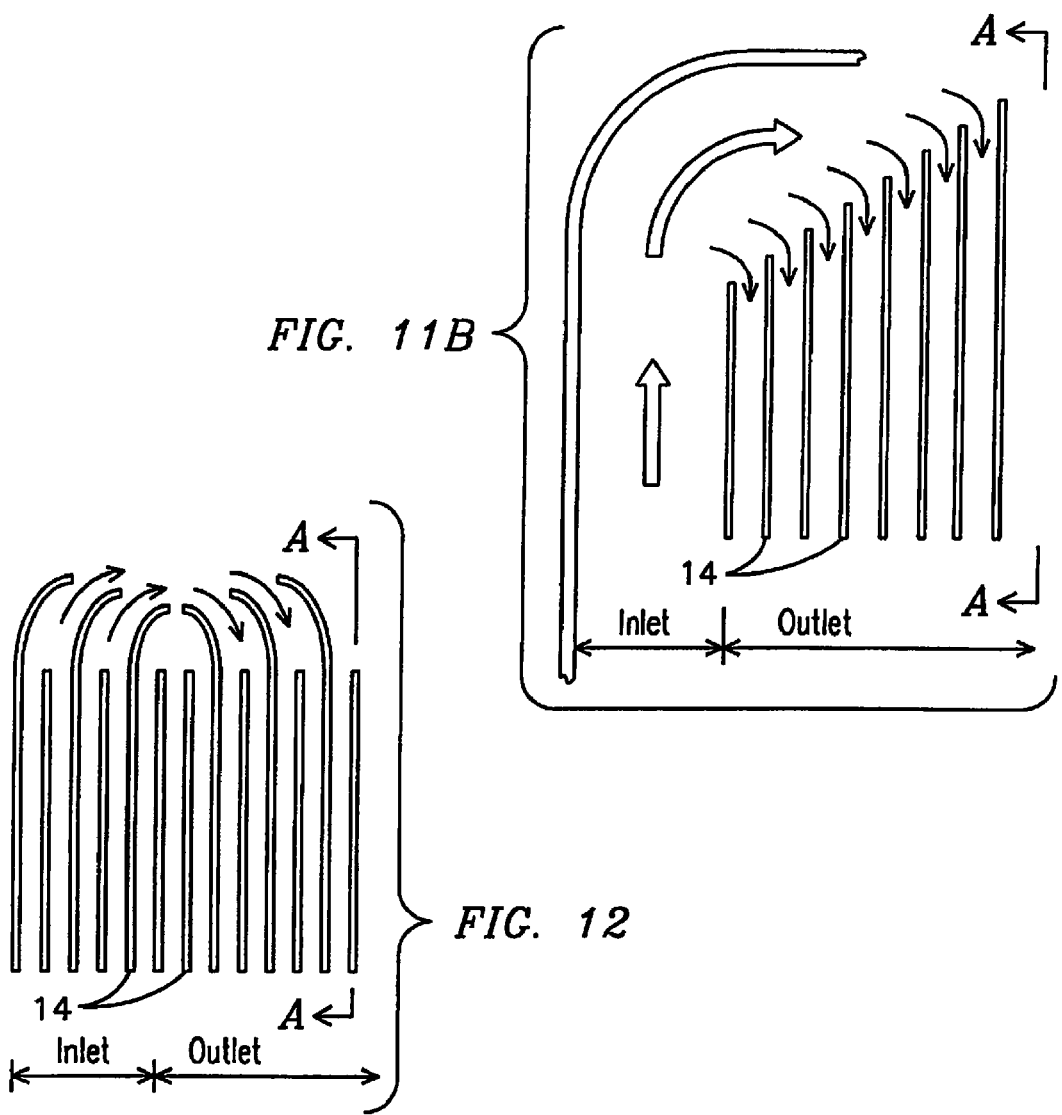
FIG. 11B
FIG. 12

HEAT SINK SYSTEM AND ASSEMBLY

CROSS-REFERENCE TO RELATED APPLICATIONS

This application is a Continuation of U.S. application Ser. No. 11/291,247 filed Dec. 1, 2005, now U.S. Pat. No. 7,472,742 which is incorporated herein by reference in its entirety.

BACKGROUND OF THE INVENTION

This invention relates to transportation vehicles that use high power electronics which require cooling systems and, more particularly, to a heat sink assembly for reducing airway blockage.

Locomotives and related transportation vehicles are equipped with power electronics whose cooling systems use finned heat sinks to aid in heat dissipation. These heat sinks are cooled by forced air. Previous heat sink designs have been used which employ typical fin arrangements with uniform spacing. The number of fins and spacing and the shape and size of the fins determine the cooling capability of the heat sink. An exemplary heat sink that is currently used in locomotives is one developed by Aavid Thermalloy.

In some situations, airflow is directed to flow through the heat sink. Such designs may be susceptible to plugging with airborne debris such as diesel fumes, dust, dirt, etc. When plugged, the heat sink's effectiveness is dramatically reduced, resulting in poor cooling of the power electronics and increased failure rates due to the excessive temperatures the electronics may experience.

BRIEF DESCRIPTION OF THE INVENTION

Embodiments of the present invention relate to a system and an assembly for cooling power electronics where reduced airborne debris clogging in the heat sink is preferred. The heat sink system includes a heat sink having a plurality of fins. The heat sink system further includes a housing configured to direct air flow around the side, top, and/or bottom of the heat sink and then through the fins of the heat sink at a back of the heat sink. The heat sink system also includes an inlet airway passage formed between a wall of the housing and said side, top, and/or bottom of the finned heat sink to allow air to pass within the housing, wherein said side, top, and/or bottom of the heat sink comprises at least one of said plurality of fins disposed directly in contact with the inlet airway passage.

In another embodiment, in a cooling system that has a heat sink system that has air passing therethrough an inlet airway passage to reach a plurality of fins on a heat sink, the heat sink system includes a transition seal between the heat sink and the inlet airway passage. The heat sink system also includes a slot proximate the inlet airway passage to receive an outer fin of the heat sink. The outer fin is of a thickness to contact the inner edges of the slot. At least one fin of the plurality of fins is in thermal connection with the inlet airway passage.

In another embodiment, the heat sink assembly includes a base element defining two dimensions of the heat sink assembly. The heat sink assembly further includes a plurality of fins attached to and extending from the base element. The heat sink assembly also includes an inlet airway passage through which air travels to reach the plurality of fins, and a transition seal between the heat sink and the inlet airflow passage. The heat sink assembly also includes a slot proximate the inlet airflow passage to receive an outer fin of the heat sink wherein the outer fin is of a thickness to contact the inner edges of the ribbed slot, wherein at least one fin of the plurality of fins is in thermal connection with the inlet airflow passage.

BRIEF DESCRIPTION OF THE DRAWINGS

A more particular description of the invention briefly described above will be rendered by reference to specific embodiments thereof that are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIGS. 11(a) and 11(b) depict illustrations of exemplary embodiment of fins of varying length; and FIG. 12 depicts a top view illustration of an exemplary embodiment of fins that are contoured.

DETAILED DESCRIPTION OF THE INVENTION

With reference to the figures, exemplary embodiments of the invention will now be described. However, it should be noted that, though the present invention describes various inventions or improvements that may be used in a heat sink system, these improvements may be used individually in a single application or various combinations, including all versions at once, may be used together. Towards this end, the exemplary embodiments discussed herein should not be viewed as individual inventions since they can be used collectively as well.

Figure 1:
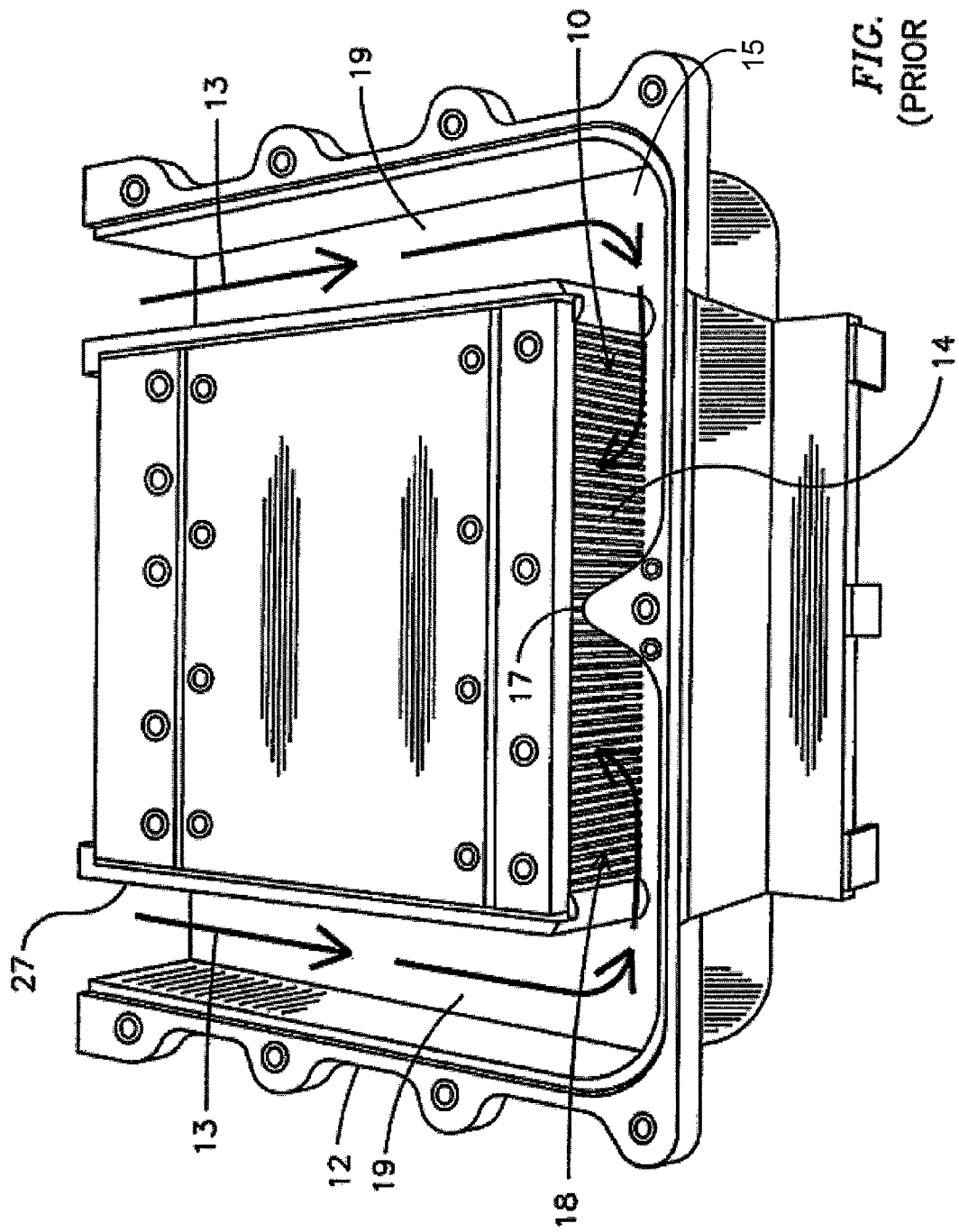
FIG. 1 depicts an exemplary illustration of a prior art housing with a prior art finned heat sink.

FIG. 1 illustrates a typical heat sink that is currently used to cool power electronics in a locomotive. The heat sink 10 is contained in a housing 12 that directs the airflow 13 through the heat sink 10. The heat sink 10 is held in position by its placement between two solid divider walls 27 separating the heat sink from an inlet airflow passages 19. The heat sink 10 has fins 14 through which airflow is directed. As the airflow 13 travels through the housing though inlet airflow passages, or passageways, 19 and experiences the bends 15 in the housing 12, heavier debris particles will be forced to the outside of the bend radius, and will impinge upon the center 17 of the heat sink face 18 where the two inlet paths converge. This phenomenon has been further verified through debris ingestion testing of heat sinks 10. Once debris clogging is initiated in the center of the heat sink 17, the plugging then proceeds to grow across the face 18 of the heat sink.

Figure 2:
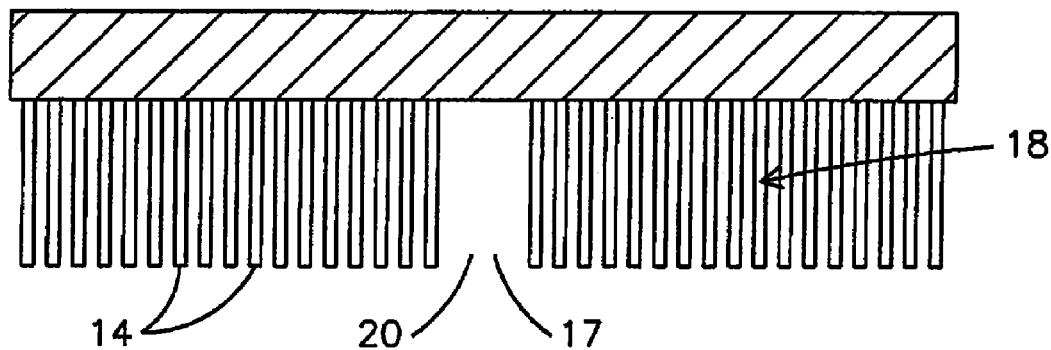
FIG. 2 depicts an exemplary embodiment of a finned heat sink cross section illustrating a center-by-pass area.

FIG. 2 depicts an exemplary embodiment of a finned heat sink cross section illustrating a center-by-pass area. By creating a center by-pass 20 in the heat sink 10, an open channel 20 through the center of the heat sink fins 14 is created which allows for debris to pass through the heat sink 10 without depositing on the inlet face 18 of the heat sink 10. To offset the removal of heat sink fins 14, the overall size of the heat sink 10 is modified in overall width, fin height, length, and number of fins to achieve equivalent thermal performance when compared to the original heat sink. This is achieved with constant spacing of the fins 14 and a bigger spacing in the bypass area 20 or by having a gradually increased spacing of the fins 14 towards the center 17 of the heat sink 10. Those skilled in the art will readily recognize that depending on where the airflow is directed and where the highest concentration of debris is expected to be deposited, the by-pass area 20 need not be in the center 17 of the face 18, but located where the highest concentration of debris is expected.

Figure 3:
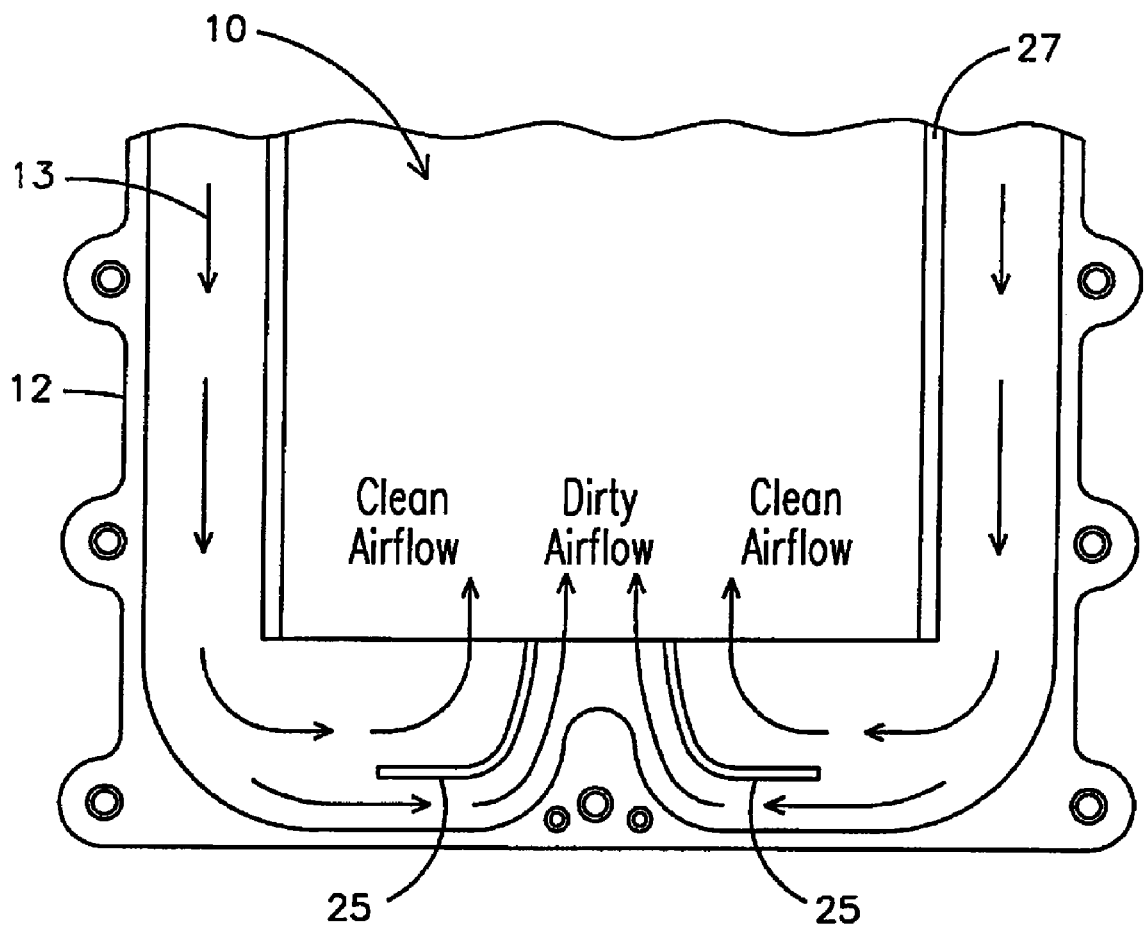
FIG. 3 depicts an exemplary embodiment of housing guide vanes within a housing holding a finned heat sink.

FIG. 3 depicts an exemplary embodiment of housing guide vanes fixed within a housing that holds a finned heat sink. Including turning vanes 25 in the housing 12 may further enhance the effectiveness of the by-pass configuration discussed above. These vanes 25 may be used to more precisely control the amount and specific portion of the airflow 13 that gets diverted through the by-pass 17. The turning vanes 25 direct heavier particles to the bigger opening so as to delay and/or avoid the initiation of plugging. Though only two vanes 25 are illustrated, a plurality of vanes 25 may be utilized.

As disclosed above, the present heat sink 10 is mounted within two solid divider walls 27 which act to locate the heat sink 10 so as to channel the airflow 13. Additional concepts of packaging the heat sink 10 may be employed to increase the volume of the heat sink 10 without increasing its overall size and/or weight. Increasing the volume allows for fins 14 to be removed/moved, which in turn allows for increased fin gap, without the apparent respective loss in heat transfer area.

Figure 4:
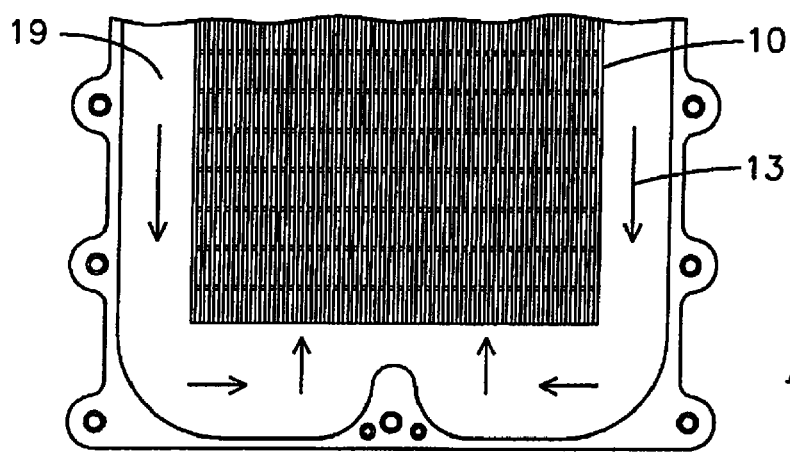
FIG. 4 depicts a top view of an exemplary embodiment of a finned heat sink within a housing where the housing's solid divider wall is removed.
Figure 5:
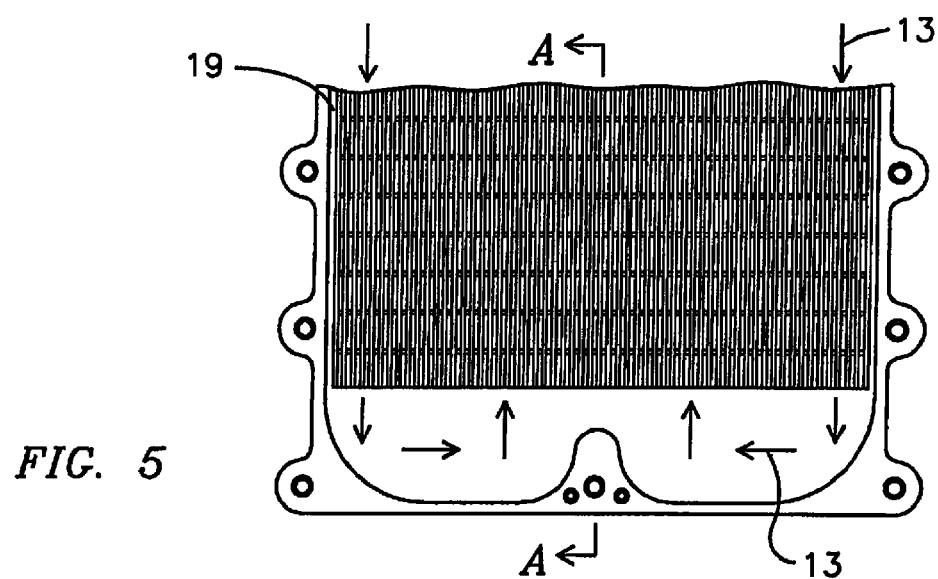
FIG. 5 depicts a top view of an exemplary embodiment of a finned heat sink within a housing where the heat sink expands into an inlet passage area.

FIGS. 4 & 5 illustrate the present design with two alternative approaches. Specifically, FIG. 4 depicts a top view of an exemplary embodiment of a finned heat sink within a housing 12 where the housing's solid divider wall is removed. In this exemplary embodiment, the divider walls 27 are removed. In an exemplary embodiment the outside heat sink fins may be made thicker than the interior fins so as to provide additional structural support and/or to improve heat transfer rates of the cooling system.

Figure 6:
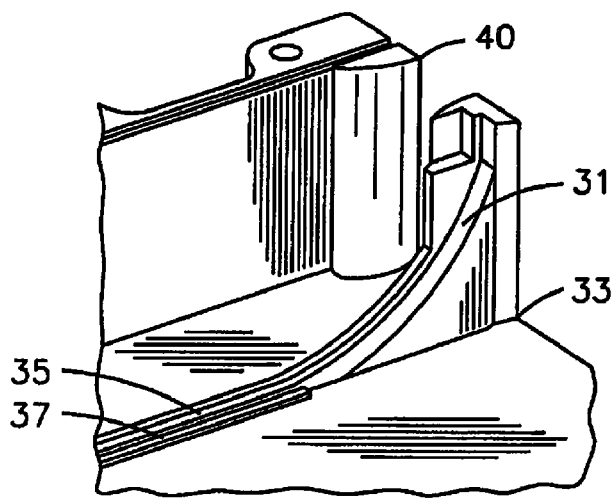
FIG. 6 depicts a detailed view of a transition seal between a heat fin and the housing.

FIG. 6 depicts a detailed view of a transition seal between a heat fin and the housing. The walls 27 are removed except a sloped portion 31 at the end of the housing 12 is provided so as to have a transition seal between the heat sink 10 and the assembly 12, including the inlet airflow passage 19, and the weldment 33. Also, a ribbed slot 35 is placed in the housing 12 to facilitate the easy location and application of a sealing member 37, such as a gasket, preferably with pressure sensitive adhesive on one side, though any sealing material may be used.

The heat sink 10 is constructed with an outer solid fin 14 that has a matching radius to the sloped portion 31 and the appropriate thickness so as to fit into the ribbed slot 35 and compresses the gasket 37 running the length of the fin 14. By such means, the heat sink 10 replaces the original divider 27.

Even though a transition seal and slope portion are disclosed to provide a seal between a heat sink and a base, those skilled in the art will readily recognize that other embodiments are possible to achieve the same connection wherein the heat sink fins 14 are in thermal connection with a base. For example, the fins 14, with their rectangular shape, may have an end that extends to the weldment. Likewise, the fins 14 that may be located in the inlet airflow passageway 19 may also be in thermal connection with the airflow passageway 19.

Figure 7:
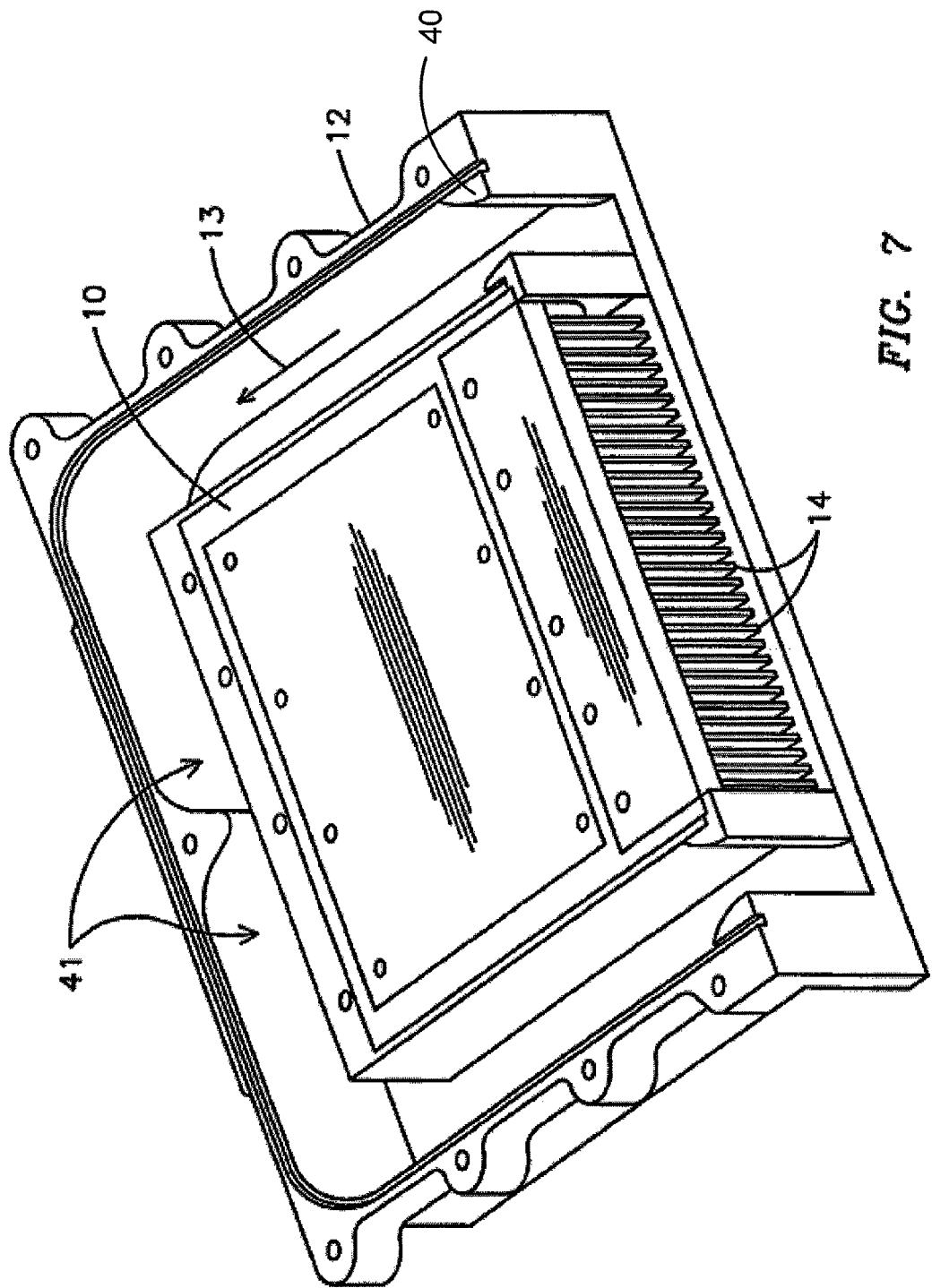
FIG. 7 depicts a heat sink within a housing where the housing has no divider walls.

In addition to keeping the pressure drop constant to allow sharing of air through many parallel heat sinks, a controlled restriction element 40 is provided. As illustrated in FIG. 7, the restriction element 40 is attached to the housing assembly 12. Those skilled in the art will readily recognize that where the housing is not used, the element can be part of the heat sink. This element 40 is used to control and/or regulate a pressure drop through the heat sink 10 due to increased spacing of fins 14. In addition with respect to the housing 12, an access port 41 (not visible but having its location(s) identified by arrows 41 in FIG. 7) is provided to facilitate inspection of heat sink clogging and/or cleaning of the heat sink 10.

In an exemplary embodiment a plurality of heat sinks, up to as many as thirty-six (36), may be used on a locomotive. The pressure drop across all heat sinks is uniform. Thus, if a new heat sink replaces a current heat sink on the locomotive, the pressure drop across this new heat sink must be uniform to the existing pressure drops across the other heat sinks. Towards this end, the restriction element 40 is sized to insure a uniform pressure drop across the replacement heat sink. By doing this, one heat sink may have a different sized restriction element 40 than another. This allows for insuring that all future heat sinks are backwards compatible with existing heat sinks in a system, such as a locomotive.

FIG. 5 depicts a top view of an exemplary embodiment of a finned heat sink within a housing assembly where the heat sink extends into an inlet passage area of the housing. In this embodiment, the divider walls 27 are removed and the heat sink 10 is larger whereas the inlet air passage 19 is converted to usable heat sink volume.

Figure 8:
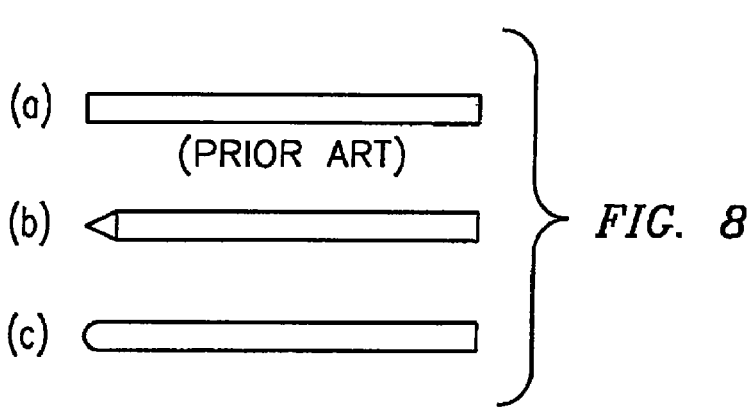
FIG. 8 depicts exemplary leading edge designs for a heat sink fin.

FIG. 8 depicts exemplary leading edge designs for a heat sink fin. An improved leading edge design can assist in reducing a rate of plugging of the heat sink 10. In the conventional heat sink fin design, illustrated in FIG. 8(a), the leading edge has a flat surface. In an improved design the leading edge is shaped with a pointed, beveled edge, illustrated in FIG. 8(b), or a rounded off edge, illustrated in FIG. 8(c). These improved leading edge designs may be applied to both the leading edge and/or trailing edge of the fins 14. In the case of fin designs that are not solid or continuous, such as the segmented or augmented fins disclosed below, these improved leading edge designs may also be extended to the leading and/or trailing edges of each of the fin segments.

Yet another concept is to improve the surface finish to reduce the propensity of particles sticking to the surface of the fins. To achieve a non-stick fin, the fin may be processed to have a very fine surface finish, or coatings may be applied to produce a non-stick surface. Teflon, fluoropolymers, PFA, PTFE, and FEP are just some of the common coatings available in industry that may be applied.

Figure 9:
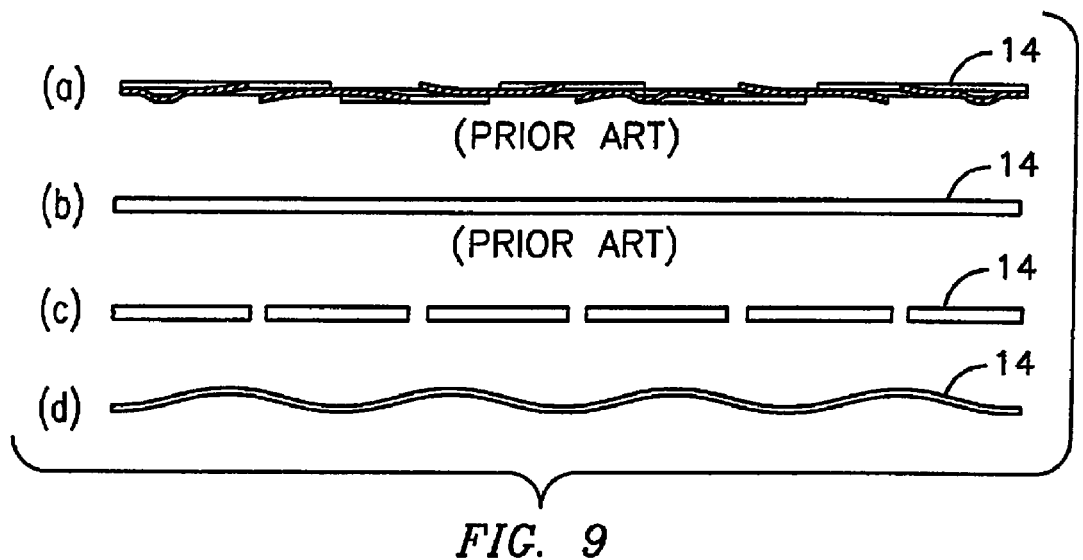
FIG. 9 depicts exemplary embodiments of various fin arrangements.

FIG. 9 depicts exemplary embodiments of various fin arrangements. As illustrated four different concepts for the fin arrangement are disclosed. The options depicted in FIG. 9(a), an augmented fin, and 9(b), a straight fin, are prior art concepts. An augmented fin has parts of the fin that extend into the area where airflow passes, which in turn may cause turbulence. The area of turbulence can result in debris buildup, or plugging. The configuration depicted in FIG. 9(c) is a segmented fin design which provides similar turbulence as an augmented design without providing edges sticking into the air stream. By not having parts of the fin extending into the airflow the probability of plugging reduces. FIG. 9(d) depicts a wavy fin design that likewise attempts to increase turbulence and heat transfer while removing leading edges that promote accretion of debris.

Figure 10:
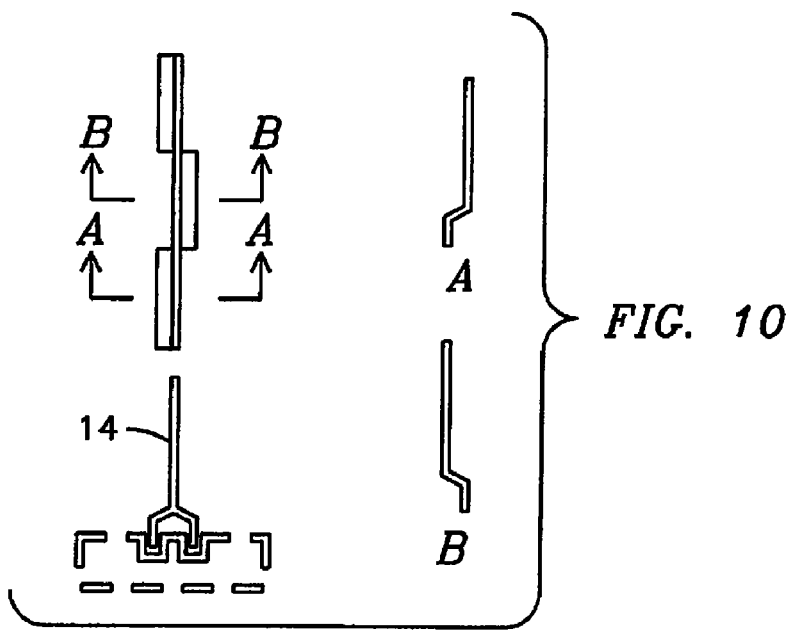
FIG. 10 depicts an exemplary prior art embodiment of how fins are divided to provide support to the fins.

In addition to providing enhanced clog resistance, edge treatment of the fins and various fin configurations may be performed or combined with other key parameters such as varied fin geometry (i.e. thickness, height, etc.) and fin spacing, to tune and/or reduce the airflow induced noise generation of the heat sink. For example, as further illustrated in FIG. 10, a straddle mount fin support system is typically used to attach each fin 14 to a base plate 29 on the heat sink 10. Since the fin thickness is usually small, the support is done by bending portions of the fins 14 in opposite direction and then supporting it on the heat sink base 29. This technique, however, increases the overall cost of the heat sink 10. By using the techniques discussed herein wherein thicker fins 14 are used and more space is provided between fins 14, the new heat sink fins 14 may be made thicker, such as illustrated in FIG. 2, so as to have a better heat transfer rate and to be able to support without the complicated/costly support mechanism required to bend portions of the fins in opposite directions.

In conventional heat sinks, the fins 14 are used for cooling and the cover and the wall dividers 27 of the housing 12 are used for airflow control. In the present invention the fins are used both for heat dissipation and airflow control. Referring back to FIG. 5, the fins are located in the airflow passage 19. FIGS. 11(a), 11(b), and 12 are exemplary embodiments of fin arrangements of varying lengths. These illustrations only show one side of fins in a heat sink, such as a side of the heat sink taken along line A-A of FIG. 5 wherein the fin arrangement is different than those shown in FIG. 5. Specifically, the areas designated as "inlet" in each figure are fins on the heat sink that are located within one side of the airflow passage. As illustrated where the fins are in the airflow passage 19, the fins in this area can be of varied length to direct the path of the airflow 13. Those skilled in the art will readily recognize that these figures are exemplary only wherein using the invention disclosed herein in other varied length fins may also be utilized to achieve a similar result.

As illustrated in FIG. 11(a), the fins in the airflow passage are longer at the outer edge of the heat sink and then reduce in length the closer the fins are to the heat sink fins that are used as an outlet for air flow. The outlet fins are also varied in length where the fins 14 closer to the inlet fins are shorter than the fins further away from the inlet fins. In another exemplary embodiment, though not shown, the outlet fins are of a constant length wherein the cascading lengths of the inlet fins will turn airflow towards the outlet fins. In another exemplary embodiment, shown in FIG. 11(b), the inlet fins are removed and the air passage directs airflow to the varying length fins.

In another exemplary embodiment, as illustrated in FIG. 12, the fins are of a longer length and curved, thus incorporating the turning vanes discussed above in the fins as opposed to being part of the housing. Not every fin needs to have a vane. For example, as illustrated every other fin has a vane as part of the fin. The vanes are of varied lengths and are used to improve turning efficiency and flow distribution of airflow. Though vanes are illustrated on the inlet fins, in another exemplary embodiment the inlet fins may not include the vanes.

When fins of varying length are used, as discussed above, housing for the heat sink may no longer be required. The housing is no longer required since the heat sink directs and controls the airflow. Towards this end, one less element is required within the cooling system, which results in a cost savings.

While the invention has been described in what is presently considered to be a preferred embodiment, many variations and modifications will become apparent to those skilled in the art. Accordingly, it is intended that the invention not be limited to the specific illustrative embodiment but be interpreted within the full spirit and scope of the appended claims.

What is claimed is:

1. A heat sink system with reduced airborne debris clogging, for cooling power electronics, the heat sink system comprising:
    a heat sink having a plurality of fins;
    a housing configured to direct air flow around the side of the heat sink and then through the fins of the heat sink at a back of the heat sink;
    an inlet airway passage formed between a wall of the housing and said side of the finned heat sink to allow air to pass within the housing, wherein said side of the heat sink comprises at least one of said plurality of fins disposed directly in contact with the inlet airway passage; and
    a transition seal between the heat sink and the inlet airway passage, said transition seal including a sloped portion having a radius of curvature and a slot proximate the inlet airway passage;
    said plurality of fins include an outer fin at an outer end of the heat sink, said outer fin having a radius of curvature to match the radius of curvature of the sloped portion and having a thickness to fit into the slot.

2. The heat sink system according to claim 1, wherein the outer fin of the heat sink is of a thickness to contact an inner edge of the slot.

3. The heat sink system according to claim 1, wherein at least one fin of the plurality of fins is in thermal connection with the inlet airway passage.

4. The heat sink system according to claim 1, wherein said plurality of fins include outer fins at opposing outer ends of the heat sink, with interior fins between the outer fins; and wherein the thickness of the outer fins is greater than a thickness of the interior fins.

5. In a cooling system for cooling power electronics where the cooling system includes a heat sink system that has air passing therethrough an inlet airway passage to reach a plurality of fins on a heat sink where reducing airborne debris clogging of the plurality of fins is preferred, the heat sink system comprising:
    a transition seal between the heat sink and the inlet airway passage; and
    a slot proximate the inlet airway passage to receive an outer fin of the heat sink;
    a restriction element attached to a housing of the heat sink to define a pressure drop through the heat sink due to increased spacing between the plurality of fins;
    wherein the outer fin is of a thickness to contact the inner edges of the slot; and
    wherein at least one fin of the plurality of fins is in thermal connection with the inlet airway passage;
    said transition seal being aligned substantially parallel with the heat sink and the inlet airway passage.

6. The heat sink assembly according to claim 5, further comprising a sealing member within the slot.

7. The heat sink assembly according to claim 5, wherein spacing between the plurality of fins is varied between fins.

* * * * *